(12) United States Patent
Trotta (10) Patent No.: US 9,500,740 B2
(45) Date of Patent: Nov. 22, 2016

(54) RECEIVER CIRCUIT, PHASED-ARRAY RECEIVER AND RADAR SYSTEM

(75) Inventor: Saverio Trotta, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 311 days.

(21) Appl. No.: 14/348,241

(22) PCT Filed: Oct. 27, 2011

(86) PCT No.: PCT/EP2011/068916
§ 371 (c)(1),
(2), (4) Date: Mar. 28, 2014

(87) PCT Pub. No.: WO2013/060376
PCT Pub. Date: May 2, 2013

(65) Prior Publication Data
US 2014/0232589 A1   Aug. 21, 2014

(51) Int. Cl.
| G01S 7/282 | (2006.01) |
| G01S 7/285 | (2006.01) |
| H03F 1/02 | (2006.01) |
| H03F 1/56 | (2006.01) |
| H03F 3/189 | (2006.01) |

(Continued)

(52) U.S. Cl.
CPC ............. *G01S 7/282* (2013.01); *G01S 7/285* (2013.01); *H01Q 3/34* (2013.01); *H03D 7/1433* (2013.01);
(Continued)

(58) Field of Classification Search
CPC ............ G01S 7/02; G01S 7/28; G01S 7/282; G01S 7/285; H04B 1/06; H04B 1/16; H04B 1/02; H04B 1/04; H04B 1/10; H04B 1/1027; H04B 1/18; H04B 1/26; H04B 1/28; H04B 1/69; H04B 1/707; H01Q 3/26; H01Q 3/30; H01Q 3/34; H03D 7/14; H03D 7/1425; H03D 7/1433; H03D 7/1458; H03D 7/16; H03D 7/165; H03D 7/12; H03F 1/02; H03F 1/0205; H03F 1/56; H03F 3/189; H03F 3/45; H03F 3/45071; H03F 3/45076; H03F 3/4508; H03F 3/45085; H03F 3/19; H03F 3/195; H03F 3/60; H03F 2200/555; H03F 2200/255; H03F 2200/09; H03F 2200/216; H03F 2200/294; H03F 2200/423; H03F 2200/222; H03F 2200/411; H03F 2200/336; H03F 2200/06; H03F 2203/45; H03F 2203/45622; H03F 2203/45596; H03F 2203/45631; H03F 2203/45554; H03F 2203/45544; H03F 2203/45594; H04M 1/06; H04M 1/0614; H04L 27/0014

See application file for complete search history.

(56) References Cited

U.S. PATENT DOCUMENTS 3,302,118 A * 1/1967 Schoen .................... H03D 7/12
455/321
4,160,953 A * 7/1979 Matsuura ................. H03D 7/12
331/58

(Continued)

FOREIGN PATENT DOCUMENTS

| EP | 1560326 A1 | 8/2005 |
| EP | 1653695 A2 | 5/2006 |
| WO | 2011/069209 A1 | 6/2011 |

OTHER PUBLICATIONS

Razavi Behzad, "A Millimeter-Wave CMOS Heterodyne Receiver With On-Chip LO and Divider", IEEE Journal of Solid-State Circuits, vol. 43, No. 2, Feb. 2008, pp. 477-485.

(Continued)

*Primary Examiner* — Bernarr Gregory
(74) *Attorney, Agent, or Firm* — Charlene R. Jacobsen (57) ABSTRACT

A receiver circuit, comprises an input balun circuit comprising a balanced balun output and being capable of receiving RF signals, an input amplification circuit comprising a balanced amplifier input and a balanced amplifier output, a single balanced in-phase mixing circuit comprising a first unbalanced RF mixer input and a balanced in-phase mixing frequency input, and a single balanced quadrature mixing circuit comprising a second unbalanced RF mixer input and a balanced quadrature mixing frequency input. The balanced amplifier input is connected to the balanced balun output, a first terminal of the balanced amplifier output is connected to provide an amplified RF signal to the first unbalanced RF mixer input and a second terminal of the balanced amplifier output is connected to provide a phase-shifted amplified RF signal to the second unbalanced RF mixer input.

20 Claims, 6 Drawing Sheets

(51) Int. Cl.
*H03F 3/195* (2006.01)
*H03F 3/45* (2006.01)
*H03F 3/60* (2006.01)
*H03D 7/14* (2006.01)
*H03D 7/16* (2006.01)
*H01Q 3/34* (2006.01)
*H04B 1/16* (2006.01)
*G01S 7/00* (2006.01)
*G01S 13/00* (2006.01)

(52) U.S. Cl.
CPC ............ *H03D 7/1458* (2013.01); *H03D 7/165* (2013.01); *H03F 1/0205* (2013.01); *H03F 1/56* (2013.01); *H03F 3/189* (2013.01); *H03F 3/195* (2013.01); *H03F 3/45085* (2013.01); *H03F 3/60* (2013.01); *H04B 1/16* (2013.01); *H03F 2200/06* (2013.01); *H03F 2200/09* (2013.01); *H03F 2200/216* (2013.01); *H03F 2200/222* (2013.01); *H03F 2200/255* (2013.01); *H03F 2200/294* (2013.01); *H03F 2200/336* (2013.01); *H03F 2200/411* (2013.01); *H03F 2200/423* (2013.01); *H03F 2200/555* (2013.01); *H03F 2203/45544* (2013.01); *H03F 2203/45554* (2013.01); *H03F 2203/45594* (2013.01); *H03F 2203/45596* (2013.01); *H03F 2203/45622* (2013.01); *H03F 2203/45631* (2013.01)

(56) References Cited

U.S. PATENT DOCUMENTS

| | | | | |
|---|---|---|---|---|
| 4,636,663 A * | 1/1987 | Jongepier | ............ | H03D 7/1425 327/113 |
| 7,020,449 B2 * | 3/2006 | Shi | ............ | H04B 1/04 330/278 |
| 7,200,188 B2 * | 4/2007 | Fague | ................ | H04L 27/0014 375/326 |
| 7,212,586 B2 * | 5/2007 | Shi | ............ | H04B 1/04 375/316 |
| 7,224,722 B2 * | 5/2007 | Shi | ............ | H04B 1/04 375/219 |
| 7,233,774 B2 * | 6/2007 | Behzad | ................ | H03D 7/1458 455/192.2 |
| 7,457,378 B1 * | 11/2008 | Sher | ........... | H04B 1/18 375/340 |
| 7,599,676 B2 * | 10/2009 | Maxim | .................... | H03D 7/14 455/258 |
| 8,121,572 B2 * | 2/2012 | Lin | .................... | H04B 1/1027 455/232.1 |
| 8,265,118 B2 * | 9/2012 | Tzeng | .................... | H04B 1/707 370/320 |
| 2008/0180579 A1 * | 7/2008 | Maxim | .................... | H04B 1/28 348/735 |
| 2008/0181337 A1 * | 7/2008 | Maxim | ................ | H03M 1/0614 375/340 |
| 2008/0181340 A1 * | 7/2008 | Maxim | ................ | H03D 7/1458 375/346 |

OTHER PUBLICATIONS

Razavi Behzad, "Design Considerations for Direct-Conversion Receivers", IEEE Transactions on Circuits and Systems—II: Analog and Digital Signal Processing, vol. 44, No. 6, Jun. 1997, pp. 428-435.

International Search Report and Written Opinion correlating to PCT/EP2011/068916 dated May 11, 2012.

* cited by examiner

RECEIVER CIRCUIT, PHASED-ARRAY RECEIVER AND RADAR SYSTEM

FIELD OF THE INVENTION

This invention relates to a receiver circuit, a phased-array receiver and a radar system.

BACKGROUND OF THE INVENTION

Multi-channel beamforming is a signal processing technique for directional signal transmission or reception and can, for example, be used in radar systems, such as for example automotive radar systems, for example installed in a car or other vehicle. This technique exploits that signals at particular angles experience constructive interference while others experience destructive interference.

Beamforming may be applied in the digital domain or in the analog domain, where a phased-array or smart antenna is an electronically steerable directional antenna. It can be used, for example, in radar or in wireless communication systems. A phased-array receiver for analog beamforming contains a group or matrix of antenna elements and associated receive channel circuits, i.e. receiver circuits, in which the relative phases of received signals are varied in such a way that the effective reception pattern of the array is directed in a desired direction and suppressed in undesired directions. Depending on the operation frequency range, overall power consumption and receiver circuit size, the group of receiver circuits may, for example, be provided on the same integrated circuit die or as separate devices. A phased-array receiver employing beamforming controls the phase and relative amplitude of the incoming signal received by each antenna element and combines the output signals delivered by receive channels associated with each antenna element in such a way that a particular radiation pattern can preferentially be observed, i.e., a phased-array receiver uses the phase difference of an incoming signal received at different antenna elements of the antenna matrix to determine the angular position of a target.

A signal may be a time varying physical quantity carrying information, e.g. a varying voltage level, for example occurring at an antenna element or receiver input when receiving an electromagnetic wave.

Figure 1:
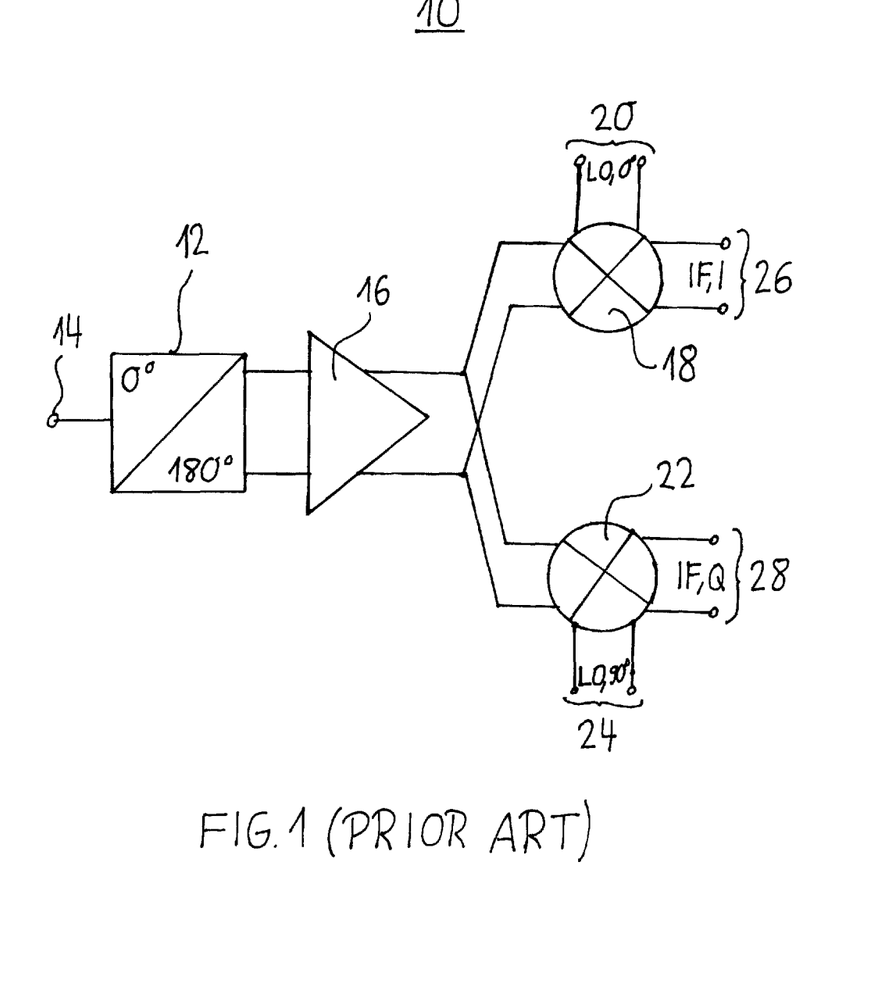
FIG. 1 schematically shows an example of a prior art receiver circuit.

For a phased-array receiver, a receiver circuit can be implemented as an I-Q receiver circuit, wherein the received signal is split and applied to two signal paths, then mixed with a pair of mixing frequency signals, for example, generated by a local oscillator circuit, with a relative 90° phase shift. The result of the frequency mixing is an in-phase signal or I-signal, and a quadrature signal, or Q-signal. As shown in FIG. 1, a prior art receiver circuit 10 commonly contains an input balun circuit 12 that is arranged to receive incoming signals, e.g., RF signals, i.e., radio frequency signals, for example, by connecting its input 14 to an antenna element. Just to give an example, this frequency range includes frequencies of radar signals, such as for example 77 GHz radar signals often used in automotive radar applications. A balun circuit is a type of electrical transformer circuit that may, for example, convert an electrical signal that is referred to ground, i.e., single-ended, to signals that are balanced, i.e., differential signals, by introducing a 180° phase-shift between them. The shown input balun circuit 12 contains a balanced output, i.e. an output with two terminals for differential signal output, wherein one terminal is arranged to provide a signal corresponding to the original input signal and a second output is arranged to provide the signal with a relative phase-shift of, for example, 180°. The balanced output of the shown input balun circuit 12 is connected to a balanced input of an RF input stage, i.e., an input RF amplification circuit 16.

The input RF amplification circuit 16 contains a balanced output connected to a first or in-phase double balanced mixing circuit 18 arranged to receive at a balanced RF input the differential amplified RF signal and to receive at a balanced mixing frequency input 20 a mixing frequency signal generated by a local oscillator (LO). The balanced output of the input RF amplification circuit 16 is also connected to a second or quadrature double balanced mixing circuit 22 arranged to receive at a balanced RF input the differential amplified RF signal and to receive at a balanced mixing frequency input 24 a mixing frequency signal with a relative 90° phase-shift against the mixing frequency signal applied to the in-phase double balanced mixing circuit 18. The in-phase double balanced mixing circuit 18 contains a balanced intermediate frequency (IF) output 26 arranged to provide a differential in-phase intermediate frequency signal or IF,I-signal. The quadrature double balanced mixing circuit 22 contains a balanced intermediate frequency (IF) output 28 arranged to provide a differential in-phase intermediate frequency signal or IF,Q-signal.

The double balanced mixing circuits 18, 22 may be implemented as standard Gilbert cells. A Gilbert cell is a transistor circuit used as an analog frequency mixer, wherein the output current is a multiplication of the differential input currents, wherein unwanted mixing products are at least partly suppressed.

SUMMARY OF THE INVENTION

The present invention provides a receiver circuit, a phased-array receiver and a radar system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary, as illustrated, for the understanding and appreciation of the underlying concepts of the present invention and in order not to obfuscate or distract from the teachings of the present invention.

Figure 2:
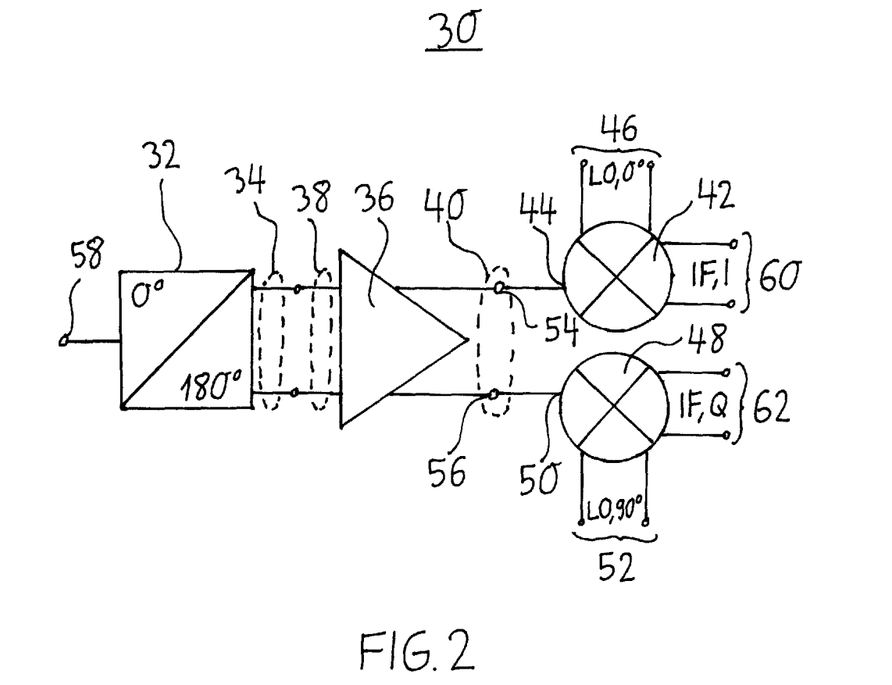
FIG. 2 schematically shows an example of a first embodiment of a receiver circuit.

Referring to FIG. 2, a first embodiment of a receiver circuit is schematically shown. The receiver circuit 30 comprises an input balun circuit 32 comprising a balanced balun output 34 and being capable of receiving RF signals, an input amplification circuit 36 comprising a balanced amplifier input 38 and a balanced amplifier output 40, a single balanced in-phase mixing circuit 42 comprising a first unbalanced RF mixer input 44 and a balanced in-phase mixing frequency input 46, and a single balanced quadrature mixing circuit 48 comprising a second unbalanced RF mixer input 50 and a balanced quadrature mixing frequency input 52; wherein the balanced amplifier input 38 is connected to the balanced balun output 34, a first terminal 54 of the balanced amplifier output 40 is connected to provide an amplified RF signal to the first unbalanced RF mixer input 44 and a second terminal 56 of the balanced amplifier output 40 is connected to provide a phase-shifted amplified RF signal to the second unbalanced RF mixer input 50.

The input balun circuit 32 may comprise an input terminal 58 capable of receiving incoming RF (radio frequency) signals. It may, for example, be connected to an antenna, such as an antenna element of a phased-array receiver.

In-phase mixing circuit 42 and quadrature mixing circuit 48 may be downconversion mixing circuits, i.e. by mixing received RF signals with in-phase and 90° phase shifted mixing frequency signals, I- and Q-mixer input signals may be converted into output signals having a frequency below those of the received RF signal. During post-processing, the intermediate frequency (IF) may or may not be further reduced. It should be noted that the term "frequency" may not only refer to a single distinct frequency value, but to a spectrum of frequencies the particular signal may comprise.

A balanced input or output may be an interface comprising two terminals for providing a differential input or output signal, wherein the two signal components have a relative phase-shift of, for example, 180° against each other.

A single balanced mixing circuit may be a mixing circuit where only one of the inputs, either the RF signal input or the mixing frequency input, is implemented as a balanced input with two terminals for receiving differential signals, whereas the other input is an unbalanced input with one terminal. For the shown receiver circuit 30, the single balanced mixing circuits 42, 48 may receive RF signals through unbalanced, single terminal RF inputs 44, 50. A receiver circuit implementation as an integrated circuit based on single balanced mixing circuits 42, 48 instead of double balanced mixing circuits may require less die area and may be easier to implement, for example, because the integrated circuit design may not have to take into account intersecting differential connecting lines between the input amplification circuit 36 and the in-phase and quadrature mixing circuits 42, 48. Less die area may be required, since the layout of single balanced mixing circuits may be less complex and may use fewer components than the layout of double balanced mixing circuits.

The in-phase mixing circuit 42 may comprise a first balanced IF output 60 arranged to provide an IF,I-signal. The quadrature mixing circuit may comprise a second balanced IF output 62 arranged to provide a corresponding IF,Q-signal. The shown receiver circuit 30 may, for example, be a receiver circuit or receive channel of a phased-array receiver and the generated IF,I- and IF-Q-signals may be applied to an IF phase rotator circuit with preserved signal quality, i.e., constant parameters, such as amplitude or phase-shift.

Figure 3:
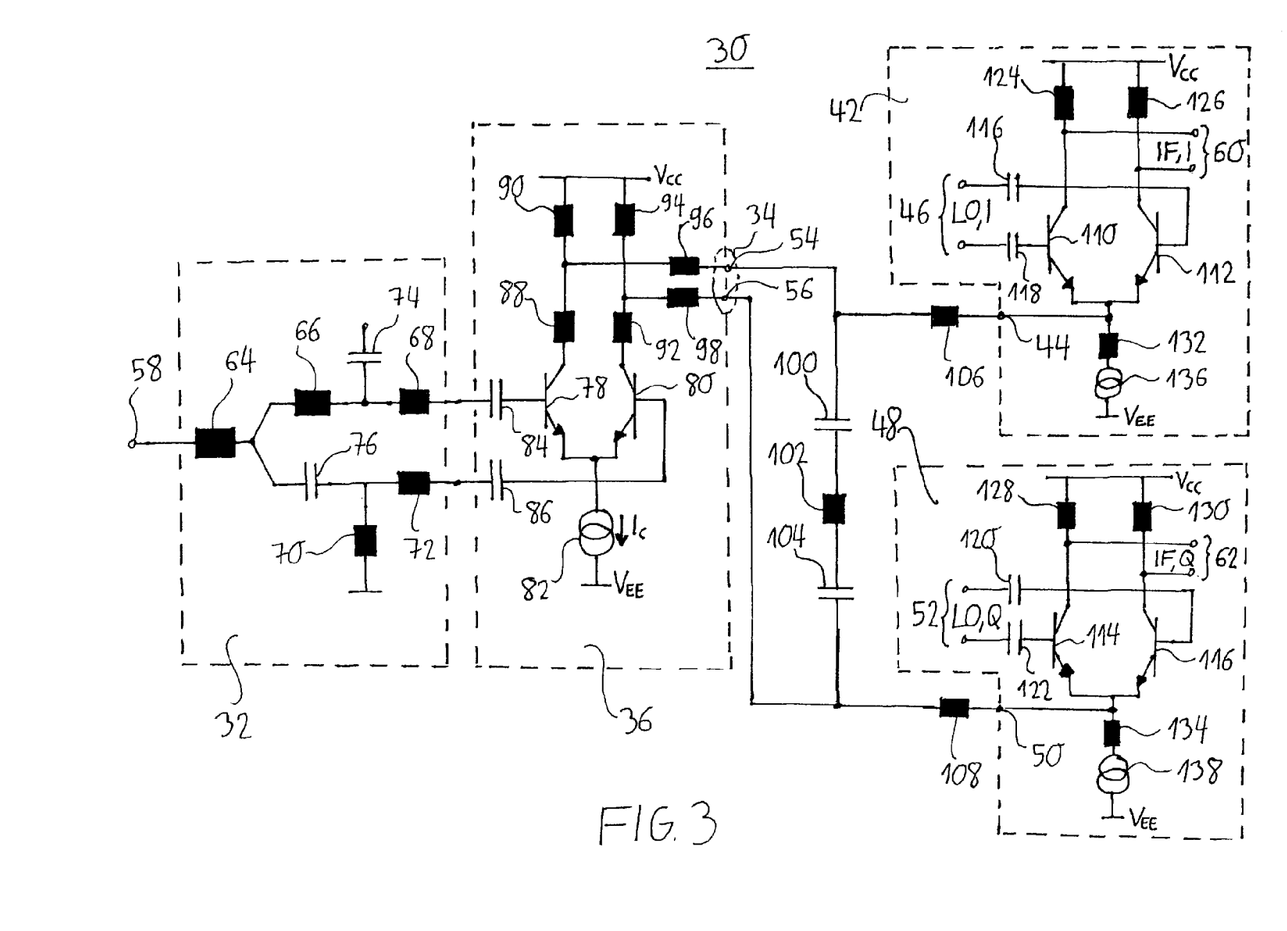
FIG. 3 schematically shows an example of a second embodiment of a receiver circuit.

Referring to FIG. 3, an example of a second embodiment of a receiver circuit is schematically shown. The shown diagram provides more details on how to possibly implement the receiver modules also shown in FIG. 2. For an RF receiver circuit, for example dedicated to operating with RF signals in the range of radar, e.g. 77 GHz automotive radar, circuits may be implemented using, for example, capacitive devices, such as capacitors, and transmission lines. For lower frequencies, transmission lines may, for example, be other connecting lines and inductive devices, e.g. coils, or for very low frequencies, where applicable, also resistors. As shown, the input balun circuit 32 may, for example, be implemented using transmission lines 64, 66, 68, 70, 72 and capacitive devices 74, 76. The shown input balun circuit 32 may provide input matching, for example 50 Ohms input matching, and may also provide two RF paths 66, 74, 68; 76, 70, 72 matched to the balanced RF input 38 of the next stage, i.e., the amplification circuit 36, with equal amplitude and 180° phase shift at differential interface 34, i.e. balanced balun output 34.

The input amplification circuit 36 may, for example, be implemented using a common emitter stage, i.e., may comprise two transistor devices 78, 80 having their emitter terminals connected to $V_{EE}$ through a common current source 82, wherein each of the control terminals, i.e. the base terminals, may be connected to receive input RF signals and phase-shifted input RF signals through corresponding capacitive devices 84, 86. The collector terminals of transistors 78, 80 may be connected to transmission lines 88, 90, 92, 94. Amplified differential RF signals may be provided to the single balanced mixing circuits 42, 48 via transmission lines 96, 98 connected between transmission lines (TL) 88, 90 and 92, 94. For example, a gain of the amplification circuit 36 may be moderate, e.g., slightly above 4 dB (decibel). It may be chosen to compensate for the loss of the splitting of the RF signal between channel I and channel Q in the input balun circuit. In this way its current density may be kept low with low drop over temperature, i.e. the gain may be kept low to reduce the temperature drop.

In order to preserve the quality of the IF,I and IF,Q-signals, which may be important, for example, when applying them to a phase rotator of a phased array receiver, a circuit structure may be used to guarantee that IF,I and IF,Q-signals show the same amplitude. The first terminal 54 of the balanced amplifier output 34 may be connected to a first capacitive coupling device 100 connected to a first transmission line 102 connected to a second capacitive coupling device 104 connected to the second terminal 56 of the balanced amplifier output 34. Capacitive coupling or AC-coupling may refer to the transfer of energy by means of the capacitance between circuit nodes. Capacitive coupling may, for example, be achieved by placing a capacitor in series with the signal to be coupled.

The first transmission line 102 may, for example, be a half-wavelength at RF transmission line, i.e., a λ/2@RF-transmission line. For a typical expected wavelength A of an incoming RF signal, the length of the first transmission line 102 may be chosen to match a length of a multiple of half a wavelength of the targeted RF signal. The presented structure may force the amplitude balanced between the complementary output signals at the first and second terminals 54, 56 of the balanced amplifier output 40.

The first terminal 54 of the balanced amplifier output 40 may be connected to provide an amplified RF signal to the first unbalanced RF mixer input 44 of the single balanced in-phase mixing circuit 42 and the second terminal 56 of the balanced amplifier output 40 may be connected to provide a phase-shifted amplified RF signal to the second unbalanced RF mixer input 50 of the single balanced quadrature mixing circuit 48. The amplified RF signals may be applied to the first and second unbalanced RF mixer inputs 44, 50 via transmission lines 106, 108, respectively.

In some embodiments, component characteristics may intentionally be chosen differently, for example, to introduce or compensate for phase or gain variations, but very often the single balanced in-phase mixing circuit 42 and the single balanced quadrature mixing circuit 48 may be implemented symmetrically using components having identical or very similar characteristics.

One or more of the single balanced in-phase mixing circuit 42 and the single balanced quadrature mixing circuit 48 may comprise two switching devices, for example two transistors 110, 112; 114, 116 connected to form a common-emitter circuit. Mixing frequency signals may be applied through balanced mixing frequency inputs 46, 52 via capacitive coupling devices 116, 118; 120, 122 to the control or base terminals of the transistors 110, 112; 114, 116.

Collector terminals of transistors 110, 112; 114, 116 may be connected to Vcc voltage supply via resistive devices 124, 126; 128, 130 and may be connected to first balanced IF output 60 and second balanced IF output 62 for providing output IF,I- and IF,Q-signals, respectively. The resistive devices 124,126; 128, 130 may, for example, also be implemented as transmission lines or coils.

Since frequency mixing of the RF signal and the mixing frequency signal may be achieved by switching on and off transistors 110, 112; 114, 116 using the components of the mixing frequency signal, transistors may be chosen such that a switching speed of the transistors may be suitable for the mixing frequency. For high frequencies, fast bipolar transistors may be used. Other switching devices, for example, field effect transistors or other types of bipolar transistors may be used that provide a sufficient switching speed for the targeted application.

The received amplified RF signal, either RF,I or RF,Q signal, may be applied at the common emitter node of the respective single balanced mixing circuit 42, 48. The common emitter node may also be connected to a transmission line 132, 134, for example a $\lambda/4@RF$ transmission line (TL), to provide a sufficiently high impedance path between the RF signal and power supply of the chip. As shown, the transmission line 132, 134 may be connected to $V_{EE}$ through a common current source 136, 138.

A $\lambda/4@RF$ transmission line or quarter-wave impedance transformer may be a transmission line having a length of a quarter or an odd multiple of a quarter of the wavelength of a typical received RF signal.

The LO AM noise conversion for the shown receiver circuit 30 may, for example, be in the range of 80-90 dB, so the small degradation that stems from not using a double-balanced mixer cell may not have a significant impact on the system.

Compared to a standard Gilbert cell, a single balanced mixing circuit 42, 48 comprises only half the amount of switching devices, which may help to half the current consumption in each mixing circuit, thereby keeping the overall current consumption similar to the current consumption of a standard non I/Q receiver circuit. The mixing frequency signal and the phase-shifted mixing frequency signal may be provided either by external mixing frequency sources or, for example, by one or more local oscillator (LO) circuits or LO buffers. A single balanced mixer may consume less power compared to a double balanced mixer. It may need less power from the LO buffer because the local oscillator may have to drive only two switching transistors instead of four. Since a single balanced mixer may inject less noise than a double balanced mixer, less amplification must be provided by the input amplification circuit 36. This may allow for a more compact and less current consuming receiver circuit.

Figure 4:
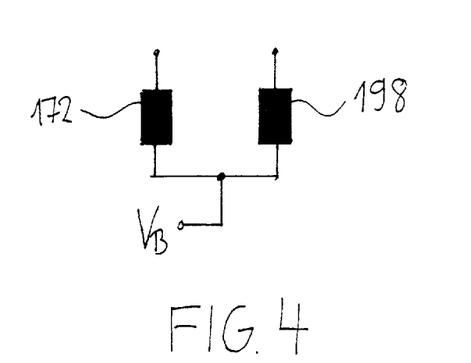
FIG. 4 schematically shows an example of a circuit arranged to provide a bias voltage.

Referring now also to FIG. 4, an example of a circuit arranged to provide a bias voltage to components of the receiver circuit is schematically shown. A control terminal of each of the two switching devices, i.e. transistors 110, 112; 114, 116 may be connected to a corresponding quarter-wavelength transmission line 172, 198 arranged to provide a common bias voltage $V_B$. For example, the control terminal of a bipolar transistor may be the base terminal. Providing a bias voltage to the control terminals using a transmission line may allow applying a bias voltage $V_B$ and at the same time not to disturb the mixing frequency signal applied to the control terminal, since the transformed impedance of the chosen bias circuit may provide a very high impedance for any signal applied to the control terminal. An alternative implementation may use high-impedance resistors instead of the transmission lines.

A corresponding bias circuit may be applied to the control terminals or base terminals of the input amplification circuit 36 for providing either the same or a different bias voltage to the amplification circuit transistor control terminals.

Figure 5:
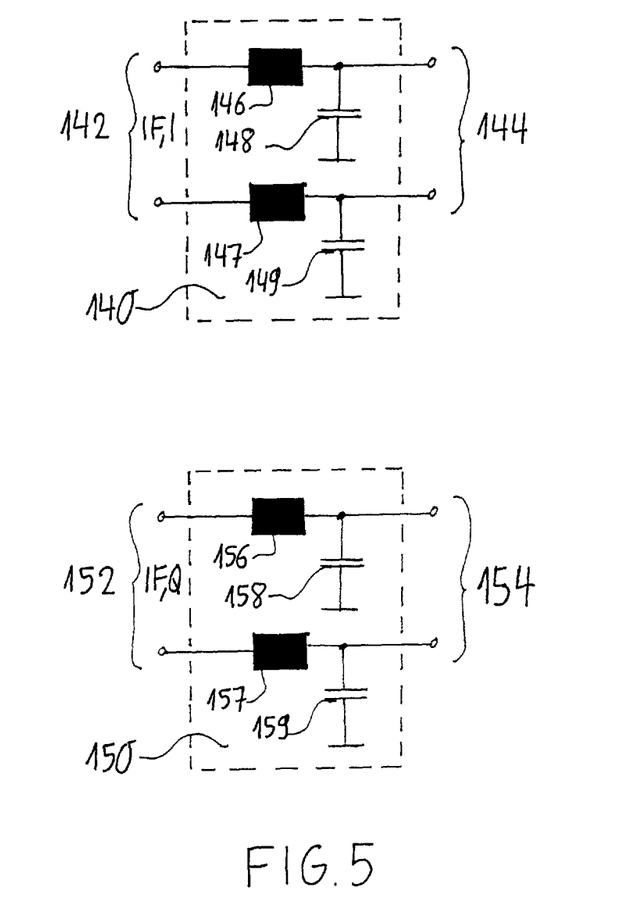
FIG. 5 schematically shows an example of an IF output filter circuit.

Referring also to FIG. 5, an example of an IF output filter circuit is schematically shown. The single balanced in-phase mixing circuit 42 may comprise an in-phase IF output 60 connected to provide an in-phase IF signal to a first filter circuit 140 per terminal arranged to remove an in-phase mixing frequency portion from the in-phase IF signal. The first filter circuit may comprise an input 142 connected to the in-phase IF output and may provide a filtered in-phase IF signal at output 144. The mixing frequency portion contained in the input RF signal may be removed or at least reduced. For example, for 77 GHz radar signals used for automotive radar applications, the LO residual power at the IF input 142 may usually be filtered out easily since it may be at 77 GHz while the IF signal may, for example, be around 10 MHz.

As shown in FIG. 5, the first filter circuit 140 may comprise at least a first quarter-wavelength transmission line 146, 147 and at least a first capacitive device 148, 149, wherein the first capacitive device 148, 149 may, for example, be connected to ground. For example, a first quarter-wavelength transmission line and a first capacitive device may be connected to each of the two terminals of differential input 142. In another embodiment, a first quarter-wavelength transmission line and a first capacitive device may be connected to only one of the two terminals of input 142.

Similarly, the single balanced quadrature mixing circuit 48 may comprise a quadrature IF output 62 connected to provide a quadrature IF signal to a second filter circuit 150 arranged to remove a quadrature mixing frequency portion from the quadrature IF signal. The second filter circuit 150 may comprise an input 152 connected to the quadrature IF output 62 and may provide a filtered quadrature IF signal at output 154. For example, the second filter circuit 150 may comprise at least a second quarter-wavelength transmission line 156, 157 and at least a second capacitive device 158, 159.

Figure 6:
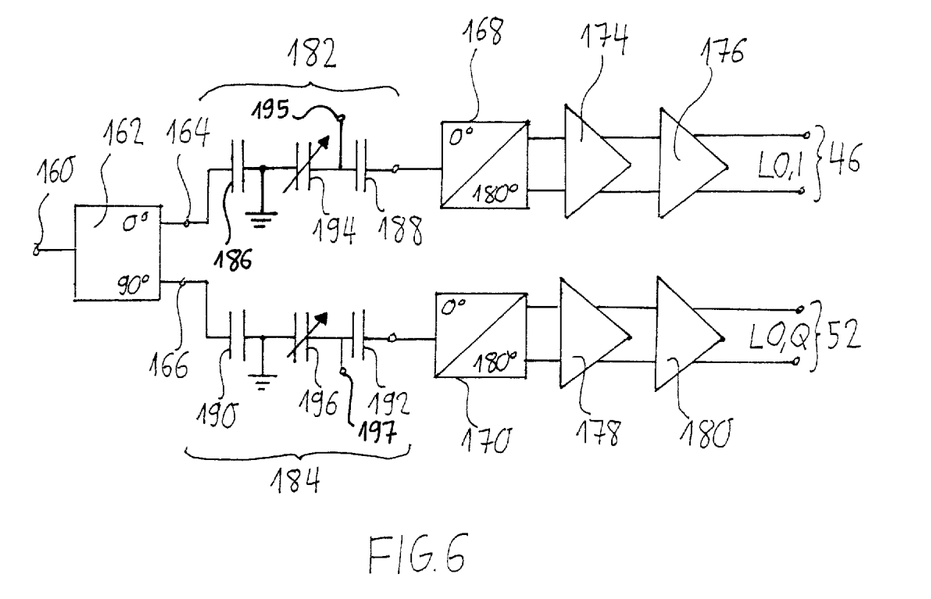
FIG. 6 schematically shows an example of a mixing frequency generation circuit for I/Q LO signals.

Referring now also to FIG. 6, an example of a mixing frequency generation circuit is schematically shown. A receiver circuit 30 may comprise a mixing frequency signal source 160 connected to a 90° hybrid coupler 162 comprising a first hybrid output 164 connected to the balanced in-phase mixing frequency input 46, and a second hybrid output 166 connected to said balanced quadrature mixing frequency input 52. The 90° hybrid coupler 162 may be a mm-wave hybrid coupler circuit. In order to convert the signals provided at the unbalanced first hybrid output 164 and second hybrid output 166 into the mixing frequency signals applied to balanced in-phase mixing frequency input 46 and balanced quadrature mixing frequency input 52, balun circuits 168, 170 may be used, for example connected to additional amplification circuits 174, 176; 178, 180.

The mixing frequency source 160 may, for example, be a local oscillator (LO) circuit or a terminal for connecting to an external mixing frequency source.

As shown, the I/Q signal generation may be done on the mixing frequency input of the single balanced in-phase and quadrature mixing circuits 42, 48. It may not be performed directly in the RF/IF path, which may degrade noise performance. The employed structures may not be complex and may be passive structures in the mm-wave range and may be broad band structures.

The receiver circuit may comprise one or more of a first fine tuning phase balancing circuit 182 connected to the first hybrid output 164 and a second fine tuning phase balancing circuit 184 connected to the second hybrid output 166. A fine tuning phase balancing circuit 182, 184 may comprise means for adjusting a non-ideal phase shift between the signals provided at the first and second hybrid outputs 164, 166. A non-ideal phase shift may, for example, differ from an ideal 90° phase shift by, for example, 2° or 3°. The difference may, for example, be frequency-dependent. The first or second fine tuning phase balancing circuit 182, 184 may, for example, comprise capacitive devices 186, 188; 190, 192. One or more of the first and second fine tuning phase balancing circuits 182, 184 may comprise a varactor circuit 194, 196, i.e., a variable-capacitance diode, that may allow to vary its capacitance depending on the applied voltage. A biasing voltage may, for example, be applied through biasing pins 195, 197.

As shown in FIG. 2 and FIG. 3, the receiver circuit 30 may be a direct conversion receiver (DCR) or homodyne receiver. A DCR is a radio receiver that is arranged to demodulate the incoming RF signal using synchronous detection driven by a local oscillator, wherein the LO frequency is similar to the carrier frequency of the intended signal. In other words, the IF,I and IF,Q-output signals are already in the intended frequency range. In another embodiment, the receiver circuit may be heterodyne receiver, where further frequency conversion may be applied to the IF signals.

Figure 7:
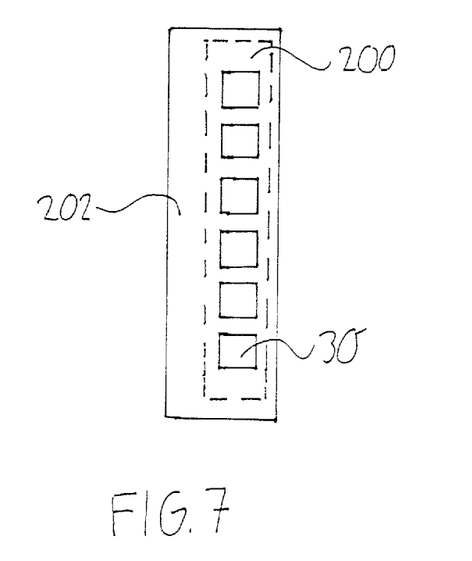
FIG. 7 schematically shows an embodiment of a radar system with a phased-array receiver.

Referring now to FIG. 7, an embodiment of a radar system 202 with a phased-array receiver 200 is schematically shown. The phased-array receiver 200 comprises at least one receiver circuit 30 as described above. The radar system 202 may comprise the phased-array receiver 200 or a receiver circuit 30 as described above. It may, for example, further comprise a sender for radiating radar signals. It should be noted that the radar frequency range may be considered a subset of the radio frequency range. The radar system 202 may be any radar system, for example an automotive radar system. The illustrated radar system may, for example, be a low-cost, high-performance automotive radar system, for example, contained in a car or other vehicle.

In the foregoing specification, the invention has been described with reference to specific examples of embodiments of the invention. It will, however, be evident that various modifications and changes may be made therein without departing from the scope of the invention as set forth in the appended claims, which accordingly are not limited to the specific examples described in this specification. For example, although as a specific example of radar frequency 77 GHz has been given, the RF signal may be any other suitable RF frequency. For example, the RF signal may have a wavelength of less than 1 meter, such as less than 1 mm, such as 0.1 mm and/or have a wavelength of more than 0.1 mm, such as more than 1 mm. The RF signal may for example have a wavelength in a range suitable for a radar system, and for example be in the microwave range of between 1 meter and 1 mm, or have a wavelength in the sub-millimeter range of between 0.1 and 1 mm. However, other RF wavelengths could also be used.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the input RF balun 32 and the input amplification circuit 36 may be provided as a single RF input stage.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the phased-array receiver 200 may be provided on a single integrated circuit die. Alternatively, the example may be implemented as any number of separate integrated circuits or separate devices interconnected with each other in a suitable manner. For example, each receiver circuit 30 of the phased-array receiver 200 may be provided as a separate integrated circuit.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While the principles of the invention have been described above in connection with specific apparatus, it is to be clearly understood that this description is made only of way of example and not as a limitation on the scope of the invention.

The invention claimed is:

1. A receiver circuit, comprising:
    an input balun circuit comprising a balanced balun output and being capable of receiving RF signals, wherein balanced outputs are differential outputs, balanced inputs are differential inputs, and unbalanced inputs are single-ended inputs;
    an input amplification circuit comprising:
        a balanced amplifier input connected to the balanced balun output; and
        a balanced amplifier output;
    a single balanced in-phase mixing circuit comprising:
        a first unbalanced RF mixer input; and
        a balanced in-phase mixing frequency input; and
    a single balanced quadrature mixing circuit comprising:
        a second unbalanced RF mixer input; and
        a balanced quadrature mixing frequency input;
    wherein
    a first terminal of said balanced amplifier output is connected to provide an amplified RF signal to said first unbalanced RF mixer input, the first terminal of said balanced amplifier output is not connected to the single balanced quadrature mixing circuit,
    a second terminal of said balanced amplifier output is connected to provide a phase-shifted amplified RF signal to said second unbalanced RF mixer input, and the second terminal of said balanced amplifier output is not connected to the single balanced in-phase mixing circuit.

2. The receiver circuit as claimed in claim 1, wherein said first terminal of said balanced amplifier output is connected to a first capacitive coupling device connected to a first transmission line connected to a second capacitive coupling device connected to said second terminal of said balanced amplifier output.

3. The receiver circuit as claimed in claim 2, wherein said first transmission line is a half-wavelength transmission line.

4. The receiver circuit as claimed in claim 1, wherein one or more of said single balanced in-phase mixing circuit and said single balanced quadrature mixing circuit comprises two transistors connected to form a common-emitter circuit.

5. The receiver circuit as claimed in claim 4, wherein a control terminal of each of said two transistors is connected to a corresponding quarter-wavelength transmission line arranged to provide a common bias voltage.

6. The receiver circuit as claimed in claim 1, wherein said single balanced in-phase mixing circuit comprises an in-phase IF output connected to provide an in-phase IF signal to a first filter circuit arranged to remove an in-phase mixing frequency portion from said in-phase IF signal.

7. The receiver as claimed in claim 6, wherein said first filter circuit comprises at least a first quarter-wavelength transmission line and at least a first capacitive device.

8. The receiver circuit as claimed in claim 1, wherein said single balanced quadrature mixing circuit comprises a quadrature IF output connected to provide a quadrature IF signal to a second filter circuit arranged to remove a quadrature mixing frequency portion from said quadrature IF signal.

9. The receiver circuit as claimed in claim 8, wherein said second filter circuit comprises at least a second quarter-wavelength transmission line and at least a second capacitive device.

10. The receiver circuit as claimed in claim 1, comprising a mixing frequency signal source connected to a 90° hybrid coupler comprising a first hybrid output connected to said balanced in-phase mixing frequency input, and a second hybrid output connected to said balanced quadrature mixing frequency input.

11. The receiver circuit as claimed in claim 10, comprising one or more of a first fine tuning phase balancing circuit connected to said first hybrid output and a second fine tuning phase balancing circuit connected to said second hybrid output.

12. The receiver circuit as claimed in claim 11, wherein one or more of said first and second fine tuning phase balancing circuits comprises a varactor circuit.

13. The receiver circuit as claimed in claim 1, wherein said receiver circuit is a direct conversion receiver.

14. A phased array receiver, comprising:
a receiver circuit as claimed in claim 1; and
an antenna connected to an input terminal of the input balun circuit for receiving an incoming RF signal.

15. A radar system, comprising:
a receiver circuit as claimed in claim 1;
an antenna connected an input terminal of the input balun circuit for receiving a radar signal; and
a sender for radiating the radar signal.

16. A receiver circuit, comprising:
an input balun circuit comprising a balanced balun output and being capable of receiving RF signals, wherein balanced outputs are differential outputs, balanced inputs are differential inputs, and unbalanced inputs are single-ended inputs;
an input amplification circuit comprising:
a balanced amplifier input connected to the balanced balun output; and
a balanced amplifier output;
a single balanced in-phase mixing circuit comprising:
a first unbalanced RF mixer input; and
a balanced in-phase mixing frequency input;
a single balanced quadrature mixing circuit comprising:
a second unbalanced RF mixer input; and
a balanced quadrature mixing frequency input;
a mixing frequency signal source connected to a 90° hybrid coupler comprising:
a first hybrid output connected to the balanced in-phase mixing frequency input; and
a second hybrid output connected to the balanced quadrature mixing frequency input; and
one or more of a first fine tuning phase balancing circuit connected to the first hybrid output and a second fine tuning phase balancing circuit connected to the second hybrid output;
wherein
a first terminal of said balanced amplifier output is connected to provide an amplified RF signal to said first unbalanced RF mixer input, the first terminal of said balanced amplifier output is not connected to the single balanced quadrature mixing circuit,
a second terminal of said balanced amplifier output is connected to provide a phase-shifted amplified RF signal to said second unbalanced RF mixer input, and the second terminal of said balanced amplifier output is not connected to the single balanced in-phase mixing circuit.

17. The receiver circuit as claimed in claim 16, wherein one or more of said first and second fine tuning phase balancing circuits comprises a varactor circuit.

18. The receiver circuit as claimed in claim 16, wherein said first terminal of said balanced amplifier output is connected to a first capacitive coupling device connected to a first transmission line connected to a second capacitive coupling device connected to said second terminal of said balanced amplifier output.

19. The receiver circuit as claimed in claim 18, wherein said first transmission line is a half-wavelength transmission line.

20. The receiver circuit as claimed in claim 16, wherein one or more of said single balanced in-phase mixing circuit and said single balanced quadrature mixing circuit comprises two transistors connected to form a common-emitter circuit.

* * * * *